United States Patent
Hong et al.

[11] Patent Number: 5,902,126
[45] Date of Patent: May 11, 1999

[54] METHODS FOR FORMING INTEGRATED CIRCUIT CAPACITOR ELECTRODES INCLUDING SURROUNDING INSULATING SIDEWALLS AND SPACERS

[75] Inventors: Sun-cheol Hong, Incheon; Yun-seung Shin, Seoul, both of Rep. of Korea

[73] Assignee: Samsung Electronics Co. Ltd., Rep. of Korea

[21] Appl. No.: 08/864,717

[22] Filed: May 28, 1997

[30] Foreign Application Priority Data

Jun. 3, 1996 [KR] Rep. of Korea .................. 96-19629

[51] Int. Cl.⁶ .................. H01L 21/70; H01L 21/8242; H01L 21/306
[52] U.S. Cl. .................. 438/396; 438/397; 438/253; 438/254; 438/703; 438/720; 438/723; 438/754; 438/756
[58] Field of Search .................. 438/253, 254, 438/396, 397, 703, 704, 720, 723, 754, 756

[56] References Cited

U.S. PATENT DOCUMENTS

| | | | |
|---|---|---|---|
| 5,330,614 | 7/1994 | Ahn | 156/631 |
| 5,508,223 | 4/1996 | Tseng | 438/396 |
| 5,510,289 | 4/1996 | Choi | 438/397 |

*Primary Examiner*—Benjamin Utech
*Assistant Examiner*—Donald L. Champagne
*Attorney, Agent, or Firm*—Myers Bigel Sibley & Sajovec

[57] ABSTRACT

A method for forming an electrode for an integrated circuit device includes the steps of forming a first insulating layer on a semiconductor substrate and forming a conductive mesa on the first insulating layer. The insulating layer has a contact hole therein exposing a portion of the substrate, and the conductive mesa covers and extends into the contact hole so that the conductive mesa is electrically connected to the substrate. A second insulating layer is formed on the first insulating layer wherein the second insulating layer surrounds the conductive mesa and wherein the second insulating layer has a second thickness greater than the first thickness. Accordingly, sidewalls of the second insulating layer are exposed adjacent the conductive mesa. Spacers are formed on the conductive mesa along the sidewalls of the second insulating layer, and the conductive mesa is etched using the second insulating layer and the spacers as an etching mask.

24 Claims, 6 Drawing Sheets

METHODS FOR FORMING INTEGRATED CIRCUIT CAPACITOR ELECTRODES INCLUDING SURROUNDING INSULATING SIDEWALLS AND SPACERS

FIELD OF THE INVENTION

The present invention relates to the field of integrated circuits and more particularly to methods for forming integrated circuit capacitor electrodes.

BACKGROUND OF THE INVENTION

Higher levels of integration for dynamic random access memories (DRAMs) are generally achieved by reducing the size of each memory cell. Accordingly, the space available for each memory cell capacitor is reduced, and the smaller memory cell capacitors may have reduced capacitance. A lower capacitance for a memory cell capacitor may increase the difficulty of low voltage operation, and a smaller capacitance may also increase soft error rates. Furthermore, a lower memory cell capacitance may result in higher levels of difficulty reading data from the memory cell.

Accordingly, there is a need in the art to provide relatively small memory cell capacitors which provide relatively high capacitances. In particular, memory cell capacitances have been increased by increasing the surface areas of the storage electrode such as by forming three-dimensional storage electrodes. For example, mesa-shaped capacitor storage electrodes have been used because the side walls of the mesa provide an increase in the surface area of the storage electrode. The surface area of the storage electrode is thus dependent on the height of the mesa. Capacitor structures are discussed, for example, in U.S. Pat. No. 5,330,614 to Ahn, the disclosure of which is hereby incorporated herein in its entirety by reference.

Figure 1:
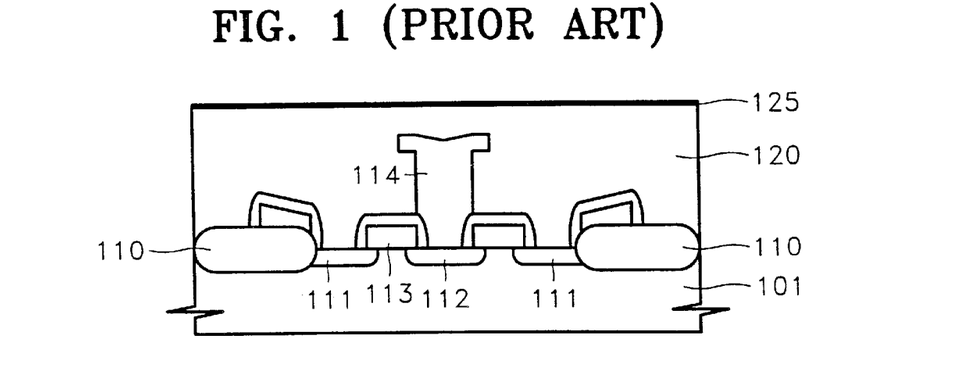
FIGS. 1, 2, 3, 4, and 5 are cross-sectional views illustrating steps of a method for forming a capacitor according to the prior art.

FIGS. 1 through 5 are cross-sectional views illustrating steps of a method for manufacturing a capacitor having a mesa-shaped storage electrode for an integrated circuit memory device according to the prior art. As shown in FIG. 1, a field oxide 110 defines active and non-active regions of the substrate 101. The memory cell access transistors are formed on the active region of the substrate, and each of these transistors includes source/drain regions 111 and 112, and a gate electrode 113. A buried bit line 114 is formed in the insulating layer 120, and this buried bit line 114 is connected to the source/drain region 112 of a memory cell access transistor. The insulating layer 120 serves as a planarization layer, and the etching stop layer 125 is formed on the insulating layer 120. In particular, the insulating layer 120 can be a layer of borophosphosilicate glass (BPSG), and the etching stop layer 125 can be a layer of silicon nitride ($Si_3N_4$).

Figure 2:
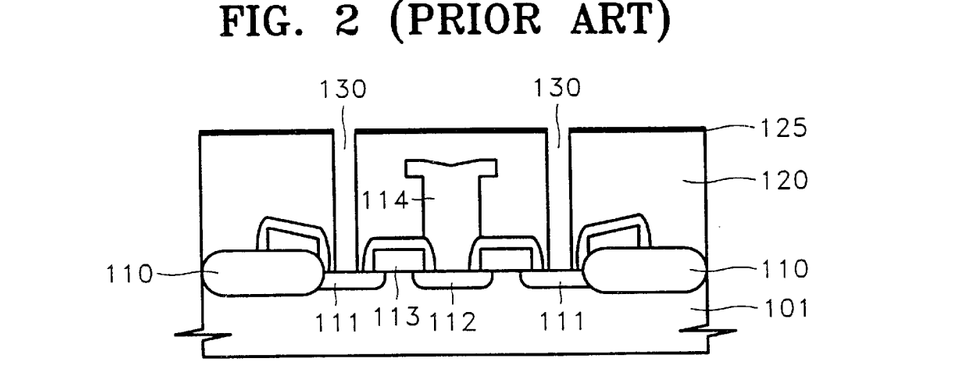

Contact holes 130 are formed in the etch stop layer 125 and the insulating layer 120 thereby exposing source/drain regions 111 of the memory cell access transistors. The contact holes can be formed using photolithography and etch steps. A conductive layer is formed on the etch stop layer 125, and this conductive layer fills the contact holes 130 thereby providing electrical contact with the source/drain regions 111. The conductive layer 140 can be a layer of doped polycrystalline silicon. A photoresist pattern 150 is then formed on the conductive layer 140 opposite the contact holes 130. In particular, the photoresist pattern 150 can be formed by coating a layer of photoresist on the conductive layer 140 and then patterning it using a photolithography step.

Figure 3:
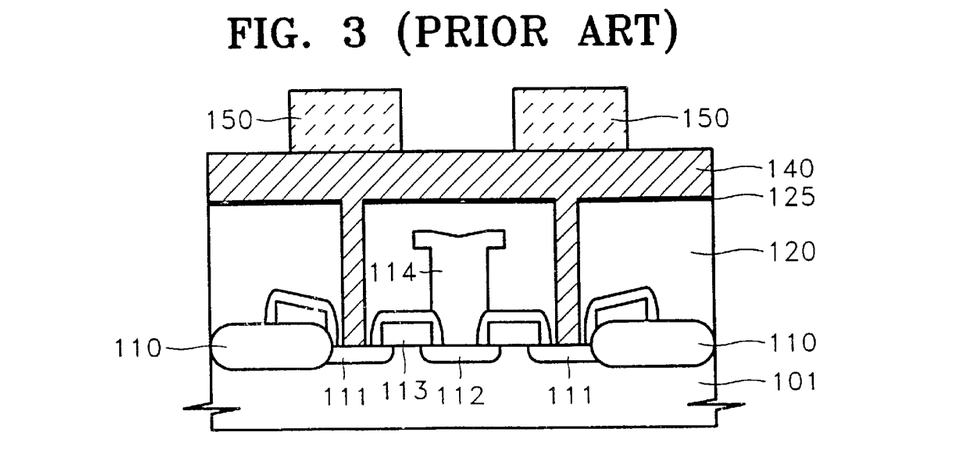
Figure 4:
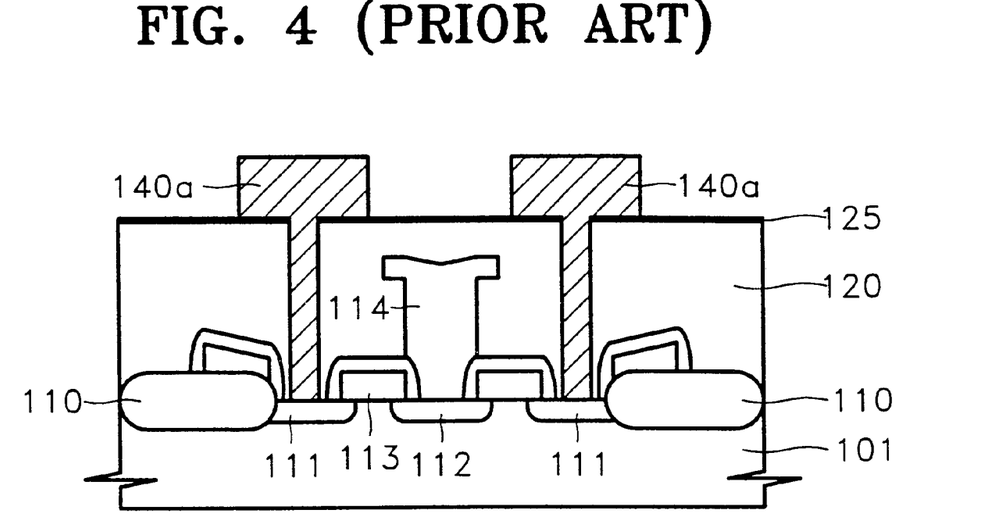

The conductive layer 140 is then patterned by etching using the photoresist pattern 150 as a mask. Accordingly, mesa-shaped storage electrodes 140a are formed on the etch stop layer 125, and each of these mesa-shaped storage electrodes is electrically connected to a respective source/drain region 111. The etch stop layer 125 can be used to reduce undercutting of the mesa-shaped storage electrode 140a. As shown in FIG. 4, the photoresist pattern is then removed.

Figure 5:
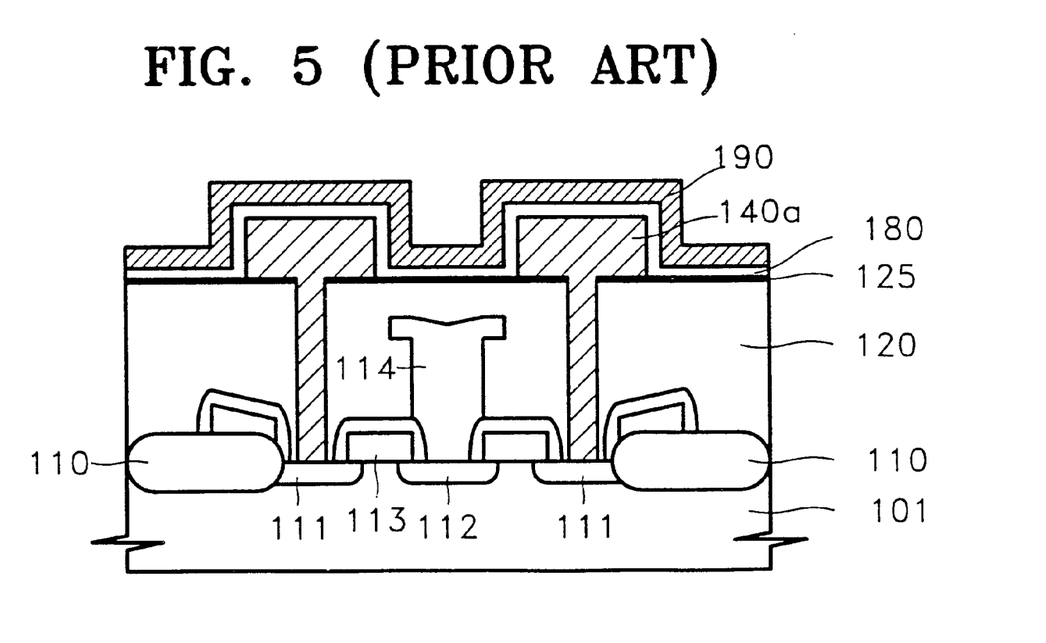

A dielectric layer 180 and a plate electrode 190 are then formed on the mesa-shaped storage electrodes 140a as shown in FIG. 5. Accordingly, a plurality of memory cell capacitors can be formed wherein each of the capacitors includes a mesa-shaped storage electrode. More particularly, the dielectric layer 180 can include an oxide/nitride/oxide (ONO) layer, and the plate electrode 190 can be formed by depositing a layer of doped polycrystalline silicon on the dielectric layer.

Accordingly, each of the memory cell capacitors of FIG. 5 has a respective capacitance proportional to the surface area of the storage electrode 140a. This surface area is equal to the sum of the area of the upper surface of the electrode 140a and the sidewalls of the electrode 140a. The surface area of the electrode 140a can thus be increased without increasing the surface area occupied by the electrode by increasing the thickness of the storage electrode thereby increasing the sidewalls thereof. By increasing the thickness of the storage electrode, the capacitance of the capacitor including the storage electrode can be increased without increasing the surface area occupied by the capacitor.

According to the method discussed above, the thickness of the storage electrode 140a can be increased to increase a capacitance for the capacitor without increasing a surface area for the capacitor. The increased thickness of the storage electrode 140a, however, may also increase a step difference between a cell array region of the memory device where the storage electrodes are formed and a peripheral circuit region not having storage electrodes. Accordingly, focus margins may be reduced for subsequent photolithography steps, and irregular reflections may also be generated. The reliability of subsequently formed metal wiring may thus be reduced. It may thus be more difficult to form metal wiring patterns on memory devices formed as discussed above.

SUMMARY OF THE INVENTION

It is therefore an object of the present invention to provide improved methods for forming capacitors.

It is another object of the present invention to provide methods for forming capacitors having increased capacitance.

It is still another object of the present invention to provide methods for forming capacitors having reduced heights.

These and other objects are provided according to the present invention by methods including the steps of forming a first insulating layer on a semiconductor substrate and forming a conductive mesa on the first insulating layer. In particular, the first insulating layer has a contact hole therein exposing a portion of the substrate, and the conductive mesa covers and extends into the contact hole so that the conductive mesa is electrically connected to the substrate. In addition, the conductive mesa has a first thickness.

A second insulating layer is formed on the first insulating layer wherein the second insulating layer surrounds the conductive mesa and wherein the second insulating layer has a second thickness greater than the first thickness. Accordingly, sidewalls of the second insulating layer are exposed adjacent the conductive mesa. Spacers are formed on the conductive mesa along the exposed sidewalls of the second insulating layer and the conductive mesa is etched using the second insulating layer and the spacers as an etching mask. Accordingly, a cylindrical storage electrode can be formed having a surface area greater than that of a conventional mesa-shaped storage electrode. When used as a storage electrode in a capacitor, an increased capacitance can thus be obtained.

This method can also include the steps of removing the spacers, and removing a portion of the second insulating layer thereby exposing sidewalls of the etched conductive mesa. A dielectric layer can then be formed on the etched conductive mesa, and a conductive layer can be formed on the dielectric layer opposite the etched conductive mesa. Accordingly, the conductive layer provides a plate electrode separated from the storage electrode by the dielectric layer. Furthermore, the step of removing the second insulating layer can include exposing the first insulating layer. The outer surfaces of the conductive electrode can thus be completely exposed. In addition, a portion of the first insulating layer adjacent the etched conductive mesa can be removed thereby forming an undercut region adjacent an edge portion of the etched conductive mesa. The exposed surface area of the etched conductive mesa can thus be further increased.

In addition, the step of forming the first insulating layer can include forming a first insulating sub-layer on the substrate, forming an etch stop layer on the first insulating sub-layer, and forming a second insulating sub-layer on the etch stop layer opposite the first insulating sub-layer. This method can also include the steps of removing the spacers, removing the second insulating layer, and removing the second insulating sub-layer. A lower surface of the etched conductive layer is thus exposed thereby increasing the exposed surface area thereof. A dielectric layer can then be formed on the etched conductive mesa, and a conductive layer can be formed on the dielectric layer opposite the etched conductive mesa. Accordingly, a capacitance of the resulting capacitor can be increased because of the increased surface area of the etched conductive mesa.

The first insulating layer can be formed from borophosphosilicate glass, and the second insulating layer and spacer can each be formed from an oxide. The step of forming the conductive mesa can include forming a mesa of doped polysilicon. In addition, the etching step can include etching the conductive mesa to a predetermined depth less than the thickness of the conductive mesa.

According to the methods of the present invention, a height of a capacitor can be reduced and a capacitance thereof can be increased. DRAMs can thus be formed having reduced step differences between cell array regions and peripheral circuit regions.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 6:
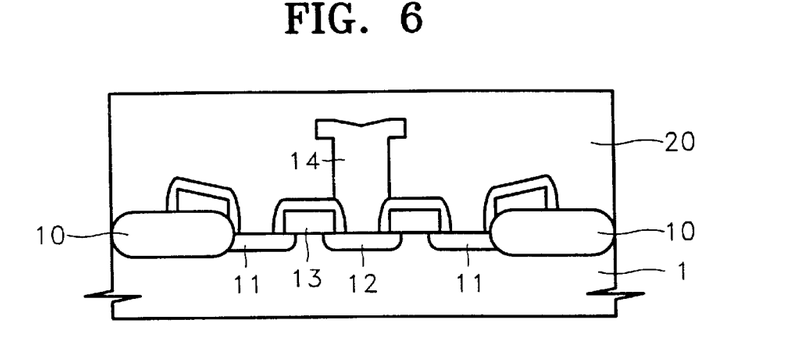
FIGS. 6, 7, 8, 9, 10, 11, 12, 13 and 14 are cross-sectional views illustrating steps of a method for forming a capacitor according to the present invention.

FIGS. 6 through 14 are cross-sectional views illustrating steps of a method for forming capacitors for integrated circuit memory devices according to the present invention. As shown in FIG. 6, a field oxide 10 defines active and non-active regions of the substrate 1. Memory cell access transistors have source/drain regions 11 and 12 and gate electrodes 13 on active regions of the substrate 1. A bit line 14 is formed within the insulating layer 20 wherein the bit line 14 is in contact with the source/drain region 12. More particularly, the bit line can be formed by providing an initial insulating layer having a contact hole therein exposing the source/drain region 12, forming the bit line on the first insulating layer, and a forming a another insulating layer on the initial insulating layer and on the bit line wherein the two insulating layers make up the insulating layer 20 shown in FIG. 6. In particular, the insulating layer 20 can be formed from a borophosphosilicate glass (BPSG) which can provide planarization for the memory device.

Figure 7:
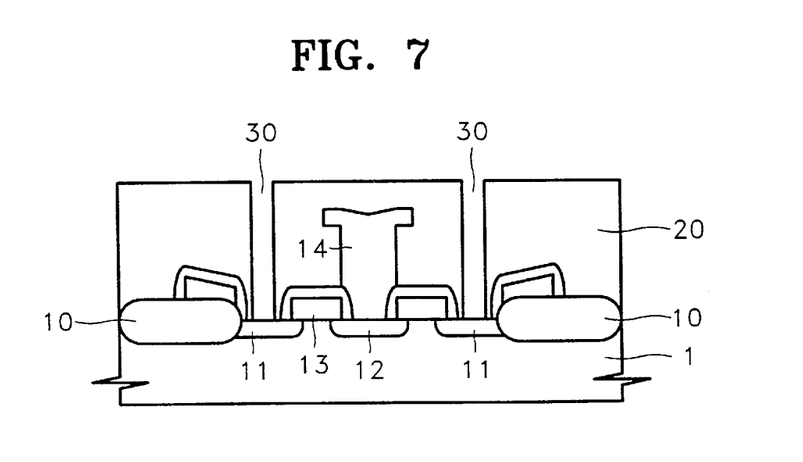

Contact holes 30 are formed on the insulating layer 20 thereby exposing the source/drain regions 11 as shown in FIG. 7. The contact holes 30 can be formed using various techniques such as a self-aligned contact forming technique or a direct contact forming technique.

Figure 8:
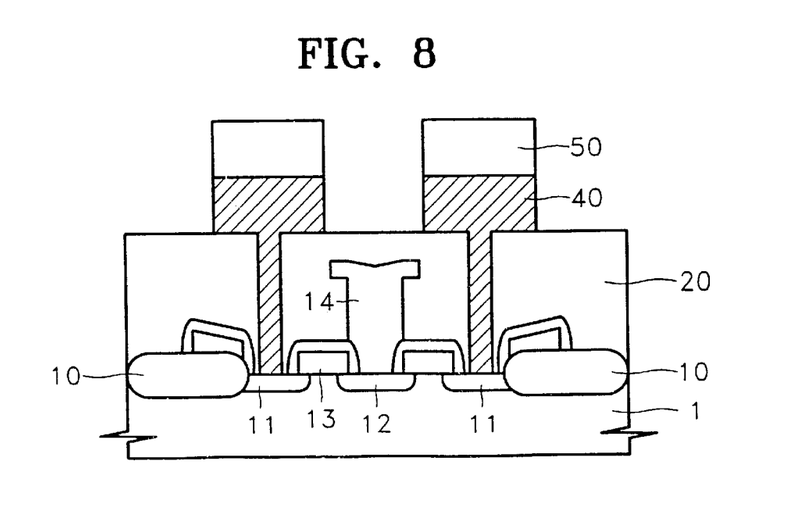

Conductive mesas are formed on the insulating layer 20 as shown in FIG. 8. In particular, a conductive layer is formed on the insulating layer 20 wherein the conductive layer fills the contact holes 30 thereby providing electrical contact with the source/drain regions 11. In particular, a conductive layer can be a layer of doped polycrystalline silicon. A photoresist pattern 50 is then formed on the conductive layer opposite the contact holes 30, and the conductive layer is etched using the photoresist pattern 50 as a mask thereby forming the conductive mesas 40. As shown, each conductive mesa 40 is connected to a respective source/drain region 11 of a memory cell access transistor. The photoresist pattern 50 is then removed.

Figure 9:
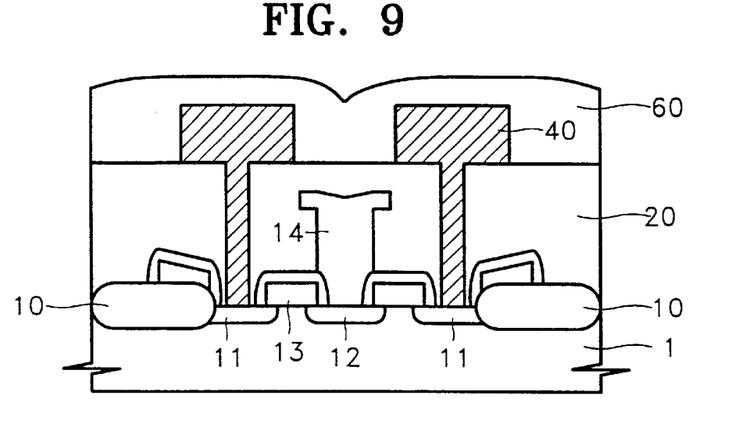

A second insulating layer 60 is then formed on the conductive mesas 40 and on the insulating layer 20 as shown in FIG. 9. The second insulating layer 60 can be an oxide layer formed using a chemical vapor deposition (CVD) step. Preferably, this insulating layer has sufficient step coverage to fill regions between the conductive mesas 40.

Figure 10:
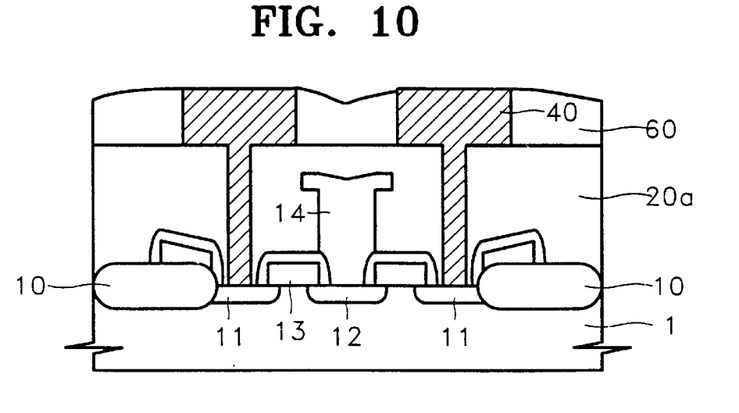
Figure 11:
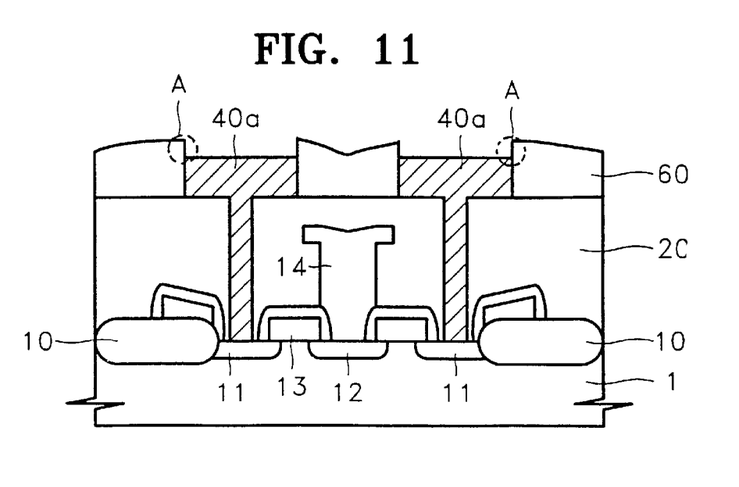
Figure 12:
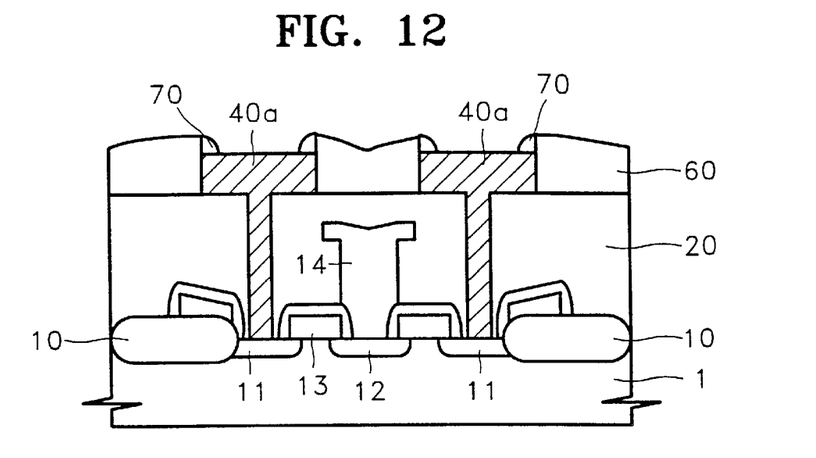

The second insulating layer 60 is then etched back to the level of the conductive mesas 40, as shown in FIG. 10. In other words, the second insulating layer 60 is etched back until the conductive mesas 40 are exposed. The conductive mesas 40 are then etched back using the second insulating layer 60 as a mask as shown in FIG. 11. Accordingly, a thickness of the conductive mesas 40a is reduced so that sidewalls A of the second insulating layer 60 are exposed adjacent the surface of the conductive mesas 40a. Spacers 70 are then formed on the conductive mesas 40a adjacent the exposed sidewalls A of the second insulating layer 60, as shown in FIG. 12. Spacers can be formed by forming a third insulating layer on the insulating layer 60 and the conductive mesas 40a. For example, the third insulating layer can be a layer of oxide or nitride formed by chemical vapor deposition (CVD). This third insulating layer can then be anisotropically etched thereby forming the spacers 70.

Figure 13:
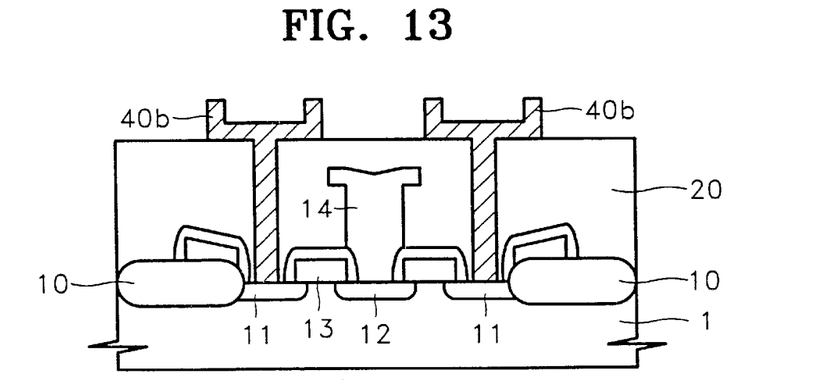
Figure 14:
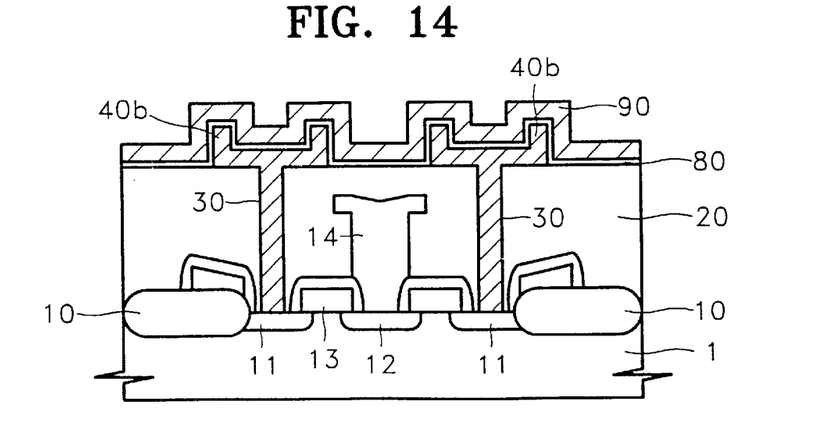

The conductive mesas 40a are then etched using the spacers 70 and the second insulating layer 60 as a mask thereby forming the cylindrical storage electrodes 40b, as shown in FIG. 13. In particular, the conductive mesa is etched to a predetermined depth that is less than a thickness of the mesa. The spacers 70 and the second insulating layer 60 are then removed thereby exposing outer surfaces of the storage electrodes 40b and also exposing the first insulating layer 20. A dielectric layer 80 and a conductive layer 90 are then formed on the storage electrodes 40b, as shown in FIG. 14. The conductive layer 90 thus provides a plate electrode separated from the storage electrode 40b by the dielectric layer 80. In particular, the conductive layer 90 can be formed from a layer of doped polycrystalline silicon.

Using the methods discussed above, it is thus possible to provide a storage electrode for a memory cell capacitor having an increased surface area and a decreased height when compared with a conventional mesa-shaped storage electrode.

Figure 15:
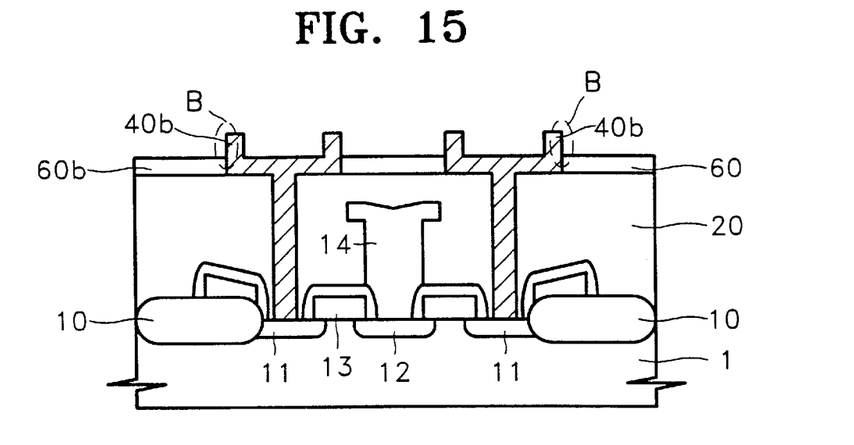
FIG. 15 is a cross-sectional view illustrating a step of an alternate method for forming a capacitor according to a second embodiment of the present invention.

Alternately, the step of removing the second insulating layer 60 can be performed as illustrated in FIG. 15. In particular, the second insulating layer 60, the conductive mesa 40a, and the spacers 70 are formed as discussed above with regard to FIGS. 6 through 12. As before, the cylindrical storage electrodes 40b are formed by etching the conductive mesa to a predetermined depth using the spacers 70 and the second insulating layer 60 as an etching mask. Again, the predetermined depth should be less than the thickness of the conductive mesa 40a.

As before, spacers 70 are removed, and the second insulating layer 60 is etched. In FIG. 15, however, the insulating layer 60 is only partially removed thereby exposing upper portions B of the outer surfaces of the storage electrodes 40b. Here, the spacers 70 and the second insulating layer 60 are preferably formed of the same material. For example, the spacers 70 and the second insulating layer 60 can be formed from oxide or nitride. As before, a dielectric layer can be formed on the storage electrodes 40b, and a conductive layer can be formed on the dielectric layer opposite the storage electrodes to provide a plate electrode.

Accordingly, a memory cell capacitor can be formed having an increased capacitance and a lower height when compared with a conventional mesa-shaped electrode. In addition, undercutting of the storage electrode 40b and lifting thereof during a wet etch can be reduced by retaining a portion of the second insulating layer 60 on the first insulating layer 20. It is thus possible to improve yields because step differences can be reduced between the cell array and peripheral circuit regions of the memory device. In addition, contamination due to lifted storage electrodes can be reduced.

Figure 16:
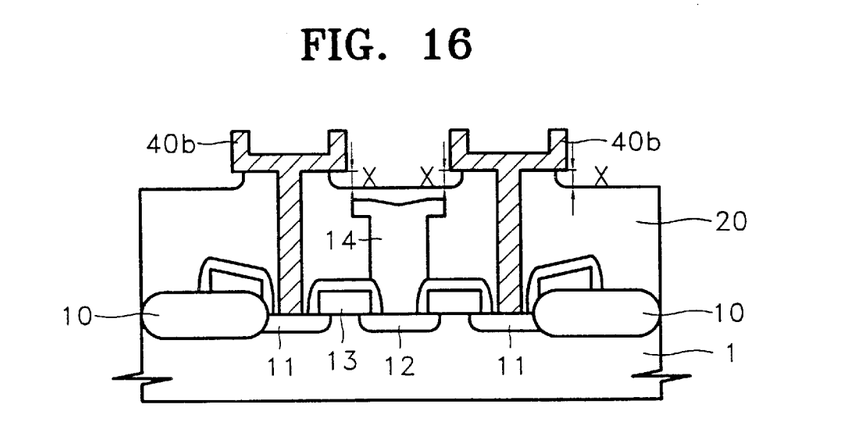
FIG. 16 is a cross-sectional view illustrating a step of another alternate method for forming a capacitor according to a third embodiment of the present invention.

Another alternative aspect of the present invention is illustrated in FIG. 16. The second insulating layer 60, the conductive mesa 40a, and the spacers 70 are formed as discussed above with reference to FIGS. 6 through 12. Again, the cylindrical storage electrode 40b is formed by etching the conductive mesa to a predetermined depth using the spacers 70 and the second insulating layer 60 as an etching mask.

Here, the outer surfaces of the storage electrodes 40b and the first insulating layer 20 are exposed by removing the spacers 70 and the second insulating layer 60. In addition, an undercut region is formed in the first insulating layer 20 below an edge portion of the storage electrodes 40b. This undercut region can be formed by isotropically etching the first insulating layer 20 by a predetermined amount X. Here, the spacers 70, the second insulating layer 60, and the first insulating layer 20 are preferably formed of the same material. For example, the spacers, the second insulating layer, and the first insulating layer can be formed from a material such as oxide or nitride. The exposed portion of the storage electrode 40b can thus be increased by providing the undercut regions. The increased surface area can thus result in an increase in capacitance of a capacitor including the electrode. As before, a dielectric layer is formed on the storage electrodes 40b, and a conductive layer is formed on the dielectric layer opposite the storage electrodes.

The storage electrodes of FIG. 16 can thus provide an increased surface area and decreased height when compared with conventional mesa-shaped storage electrodes. It is also possible to reduce step differences between cell array regions and peripheral circuit regions of the integrated circuit device.

Figure 17:
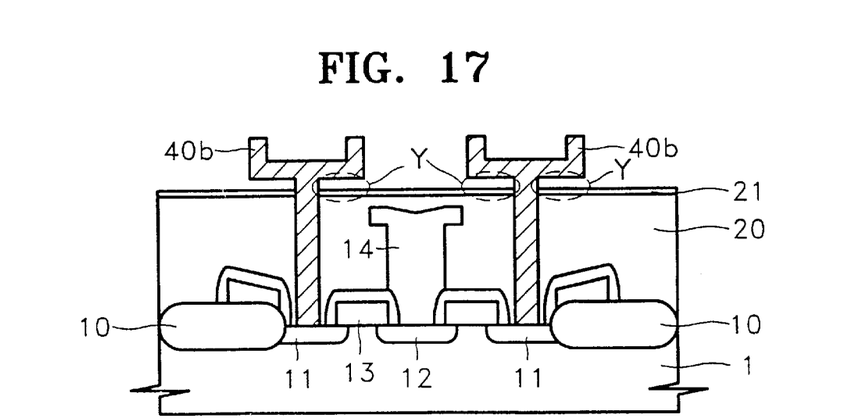
FIG. 17 is a cross-sectional view illustrating a step of still another alternate method for forming a capacitor according to a fourth embodiment of the present invention.

Yet another alternative aspect of the present invention is illustrated in FIG. 17. Here, the insulating layer 20 is formed as discussed above with regard to FIG. 6. However, an etch stop layer and an upper insulating layer are formed on the first insulating layer 20. In particular, the etch stop layer is preferably formed from nitride, and the upper insulating layer is preferably formed from oxide. The etch stop layer and the upper insulating layer can have respective thicknesses in the range of 100 to 200 Angstroms and in the range of 1,000 to 2,000 Angstroms.

Contact holes exposing the source/drain regions 11 are formed in the upper insulating layer, the etch stop layer, and the first insulating layer 20. The conductive mesa 40a, the second insulating layer 60, and the spacers 70 are formed on the upper insulating layer as discussed above. In particular, each of the conductive mesas is electrically connected to a respective source/drain region 11 through a respective contact hole. Here, the second insulating layer 60, the spacers 70, and the upper insulating layer are preferably formed with a common material such as an oxide.

The cylindrical storage electrode 40b is then formed by etching the center portion of the conductive mesa 40a to a predetermined depth using the spacers 70 and the second insulating layer 60 as an etching mask. Again, the predetermined etch depth should be less than the thickness of the conductive mesa 40a. The spacers 70, the second insulating layer 60, and the upper insulating layer can then be removed using a wet etchant such as an HF solution or a buffered oxide etchant (DOE). Accordingly, an undercut region Y is formed between the cylindrical storage electrodes 40b and the etch stop layer 21.

A dielectric layer is then formed on the cylindrical storage electrodes 40b, and a conductive layer is formed on the dielectric layer opposite the storage electrodes. Accordingly, the exposed surface area of the storage electrodes 40b can be further increased when compared to the structures of FIGS. 14, 15, and 16, by forming the undercut region Y. The capacitance of a capacitor using the storage electrodes of FIG. 17 can thus be increased. It is thus possible to reduce step differences between cell array and peripheral circuit regions of a memory device while increasing a capacitance of a memory cell capacitor.

Using the methods discussed above, it is possible to form dynamic random access memory devices having cylindrical capacitor storage electrodes wherein step differences between cell array regions and peripheral circuit regions are reduced when compared to DRAMs having conventional mesa-shaped storage electrodes. In addition, capacitances can be increased. Highly integrated memory devices can thus be fabricated while maintaining sufficient memory cell capacitances. In addition, the reduction in step differences can facilitate the formation of metal wiring subsequent to the formation of the memory cell capacitors.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming a capacitor electrode for an integrated circuit device, said method comprising the steps of:
   forming a first insulating layer on a semiconductor substrate wherein said insulating layer has a contact hole therein exposing a portion of said substrate;
   forming a conductive mesa on said first insulating layer wherein said conductive mesa has a first thickness, wherein said conductive mesa covers and extends into said contact hole so that said conductive mesa is electrically connected to said substrate, and wherein said conductive mesa has mesa sidewalls extending from said first insulating layer to a surface of said mesa opposite said substrate;
   forming a second insulating layer on said first insulating layer and adjacent said mesa sidewalls wherein said second insulating layer surrounds said conductive mesa and wherein said second insulating layer has a second thickness greater than said first thickness so that insulating sidewalls of said second insulating layer are exposed adjacent said conductive mesa and expose said surface of said conductive mesa to an edge thereof;
   forming spacers on said conductive mesa along said sidewalls of said second insulating layer; and
   etching said conductive mesa using said second insulating layer and said spacers as an etching mask.

2. A method according to claim 1 wherein said first insulating layer comprises borophosphosilicate glass (BPSG).

3. A method according to claim 1 wherein said second insulating layer and said spacer each comprise an oxide formed by chemical vapor deposition (CVD).

4. A method according to claim 1 wherein said step of forming said conductive mesa comprises forming a mesa of doped polysilicon.

5. A method according to claim 1 wherein said etching step comprises etching said conductive mesa to a depth less than said first thickness.

6. A method according to claim 1 further comprising the steps of:
   removing said spacers;
   removing a portion of said second insulating layer thereby exposing portions of said mesa sidewalls of said etched conductive mesa so that a remaining portion of said second insulating layer covers a lower portion of said mesa sidewalls adjacent said first insulating layer;
   forming a dielectric layer on said etched conductive mesa; and
   forming a conductive layer on said dielectric layer opposite said etched conductive mesa.

7. A method according to claim 1 further comprising the steps of:
   removing said spacers;
   removing said second insulating layer thereby exposing said first insulating layer;
   forming a dielectric layer on said etched conductive mesa; and
   forming a conductive layer on said dielectric layer opposite said etched conductive mesa.

8. A method according to claim 1 further comprising the steps of:
   removing said spacers;
   removing said second insulating layer;
   removing a portion of said first insulating layer adjacent said etched conductive mesa thereby forming an under cut region adjacent an edge portion of said etched conductive mesa;
   forming a dielectric layer on said etched conductive mesa; and
   forming a conductive layer on said dielectric layer opposite said etched conductive mesa.

9. A method according to claim 1 wherein said step of forming said first insulating layer comprises forming a first insulating sub-layer on said substrate, forming an etch stop layer on said first insulating sub-layer, and forming a second insulating sub-layer on said etch stop layer opposite said first insulating sub-layer, said method further comprising the steps of:
   removing said spacers;
   removing said second insulating layer;
   removing said second insulating sub-layer;
   forming a dielectric layer on said etched conductive mesa; and
   forming a conductive layer on said dielectric layer opposite said etched conductive mesa.

10. A method according to claim 9 wherein said etch stop layer comprises nitride.

11. A method according to claim 9 wherein said second insulating sub-layer comprises oxide.

12. A method according to claim 1 wherein said step of forming said second insulating layer comprises forming said second insulating layer with said second thickness initially equal to said first thickness and then etching said conductive mesa using said second insulating layer as a mask thereby reducing said first thickness so that said first thickness is then less than said second thickness.

13. A method for forming an integrated circuit memory device, said method comprising the steps of:
   forming a memory cell access transistor on a semiconductor substrate wherein said memory cell access transistor includes a source/drain region of said substrate;
   forming a first insulating layer on a semiconductor substrate wherein said insulating layer has a contact hole therein exposing a portion of said source/drain region;
   forming a conductive mesa on said first insulating layer wherein said conductive mesa has a first thickness, wherein said conductive mesa covers and extends into said contact hole so that said conductive mesa is electrically connected to said source/drain region of said substrate and wherein said conductive mesa has mesa sidewalls extending from said first insulating layer to a surface of said mesa opposite said substrate;

forming a second insulating layer on said first insulating layer and adjacent said mesa sidewalls wherein said second insulating layer surrounds said conductive mesa and wherein said second insulating layer has a second thickness greater than said first thickness so that insulating sidewalls of said second insulating layer are exposed adjacent said conductive mesa and expose said surface of said conductive mesa to an edge thereof;

forming spacers on said conductive mesa along said exposed sidewalls of said second insulating layer; and etching said conductive mesa using said second insulating layer and said spacers as an etching mask.

14. A method according to claim 13 wherein said first insulating layer comprises borophosphosilicate glass (BPSG).

15. A method according to claim 13 wherein said second insulating layer and said spacer each comprise an oxide formed by chemical vapor deposition (CVD).

16. A method according to claim 13 wherein said step of forming said conductive mesa comprises forming a mesa of doped polysilicon.

17. A method according to claim 13 wherein said etching step comprises etching said conductive mesa to a depth less than said first thickness.

18. A method according to claim 13 further comprising the steps of:

removing said spacers;

removing a portion of said second insulating layer thereby exposing portions of said mesa sidewalls of said etched conductive mesa so that a remaining portion of said second insulating layer covers a lower portion of said mesa sidewalls adjacent said first insulating layer;

forming a dielectric layer on said etched conductive mesa; and forming a conductive layer on said dielectric layer opposite said etched conductive mesa.

19. A method according to claim 13 further comprising the steps of:

removing said spacers;

removing said second insulating layer thereby exposing said first insulating layer;

forming a dielectric layer on said etched conductive mesa; and forming a conductive layer on said dielectric layer opposite said etched conductive mesa.

20. A method according to claim 13 further comprising the steps of:

removing said spacers;

removing said second insulating layer;

removing a portion of said first insulating layer adjacent said etched conductive mesa thereby forming an under cut region adjacent an edge portion of said etched conductive mesa;

forming a dielectric layer on said etched conductive mesa; and forming a conductive layer on said dielectric layer opposite said etched conductive mesa.

21. A method according to claim 13 wherein said step of forming said first insulating layer comprises forming a first insulating sub-layer on said substrate, forming an etch stop layer on said first insulating sub-layer, and forming a second insulating sub-layer on said etch stop layer opposite said first insulating sub-layer, said method further comprising the steps of:

removing said spacers;

removing said second insulating layer;

removing said second insulating sub-layer;

forming a dielectric layer on said etched conductive mesa; and forming a conductive layer on said dielectric layer opposite said etched conductive mesa.

22. A method according to claim 21 wherein said etch stop layer comprises nitride.

23. A method according to claim 21 wherein said second insulating sub-layer comprises oxide.

24. A method according to claim 13 wherein said step of forming said second insulating layer comprises forming said second insulating layer with said second thickness initially equal to said first thickness and then etching said conductive mesa using said second insulating layer as a mask thereby reducing said first thickness so that said first thickness is then less than said second thickness.

* * * * *